United States Patent
Staude et al.

(10) Patent No.: US 12,354,823 B2
(45) Date of Patent: Jul. 8, 2025

(54) INPUT DEVICE FOR A MOTOR VEHICLE WITH VOLTAGE-BASED ERROR DETECTION

(71) Applicant: Valeo Schalter und Sensoren GmbH, Bietigheim-Bissingen (DE)

(72) Inventors: Sascha Staude, Bietigheim-Bissingen (DE); Florian Leucht, Bietigheim-Bissingen (DE); Benjamin Dietz, Bietigheim-Bissingen (DE); Raphael Mack, Bietigheim-Bissingen (DE)

(73) Assignee: VALEO SCHALTER UND SENSOREN GMBH, Bietigheim-Bissingen (DE)

( * ) Notice: Subject to any disclaimer, the term of this patent is extended or adjusted under 35 U.S.C. 154(b) by 181 days.

(21) Appl. No.: 18/031,489

(22) PCT Filed: Oct. 6, 2021

(86) PCT No.: PCT/EP2021/077514
§ 371 (c)(1),
(2) Date: Apr. 12, 2023

(87) PCT Pub. No.: WO2022/078831
PCT Pub. Date: Apr. 21, 2022

(65) Prior Publication Data
US 2023/0377813 A1 Nov. 23, 2023

(30) Foreign Application Priority Data
Oct. 13, 2020 (DE) ...................... 10 2020 126 777.0

(51) Int. Cl.
*H01H 9/16* (2006.01)
*G01R 31/327* (2006.01)

(52) U.S. Cl.
CPC ......... *H01H 9/167* (2013.01); *G01R 31/3277* (2013.01)

(58) Field of Classification Search
CPC ....... G01R 31/3277; H01H 9/16; H01H 9/167
See application file for complete search history.

(56) References Cited

U.S. PATENT DOCUMENTS

| | | | |
|---|---|---|---|
| 5,508,626 A * | 4/1996 | Halin | G08B 25/018 340/505 |
| 6,423,918 B1 | 7/2002 | King et al. | |

(Continued)

FOREIGN PATENT DOCUMENTS

| | | |
|---|---|---|
| DE | 102008044115 A1 | 6/2010 |
| DE | 102017113905 A1 | 12/2018 |

(Continued)

OTHER PUBLICATIONS

International Search Report and Written Opinion in corresponding International Application No. PCT/EP2021/077514, dated Feb. 11, 2022 (14 pages).

*Primary Examiner* — Harry R Behm
(74) *Attorney, Agent, or Firm* — Osha Bergman Watanabe & Burton LLP

(57) ABSTRACT

The invention relates to an input device (1) for safety-relevant functions of a motor vehicle, having a switch contact (3) with a first connection (4) and a mating contact (5) with a second connection (6). A first resistor (9) is connected between a voltage supply connection (8) and one connection (4, 6) of the switch element (2) and a second voltage supply connection (7) is connected to the other connection (4, 6) of the switch element (2). A measuring node (10), via which an actuation-dependent voltage can be captured, is provided between the first resistor (9) and the associated connection (4, 6). The problem addressed by the invention is that of developing input devices of the type in (Continued)

Figure 5A:
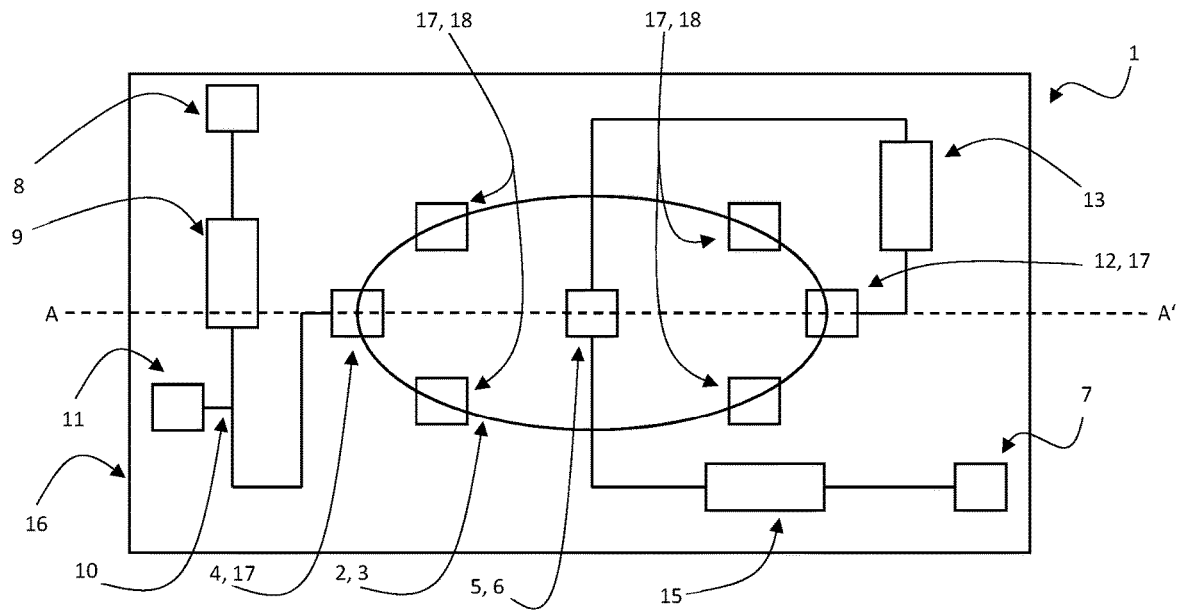

question such that they can be used for safety-relevant applications in the motor vehicle. This problem is solved by the switch contact (3) having a third connection (12) at which a second resistor (13), which is connected to the second connection (6) of the switch element (2), is provided.

12 Claims, 4 Drawing Sheets

(56) References Cited

U.S. PATENT DOCUMENTS

| | | | |
|---|---|---|---|
| 7,825,345 | B1 | 11/2010 | Kano |
| 2008/0105527 | A1* | 5/2008 | Leftly .................. H01H 13/785 |
| | | | 200/530 |
| 2014/0001016 | A1* | 1/2014 | Flegel .................... H01H 21/58 |
| | | | 200/271 |
| 2014/0144765 | A1 | 5/2014 | Lee |
| 2021/0005402 | A1* | 1/2021 | Kuramochi ........ G01R 31/3277 |

FOREIGN PATENT DOCUMENTS

| | | | | |
|---|---|---|---|---|
| DE | 102018208577 | A1 | 12/2019 | |
| EP | 2001034 | A2 | 12/2008 | |
| WO | WO-2007060330 | A1 * | 5/2007 | ............. H01H 9/167 |
| WO | WO-2011101581 | A1 * | 8/2011 | ............. F02K 1/763 |

\* cited by examiner

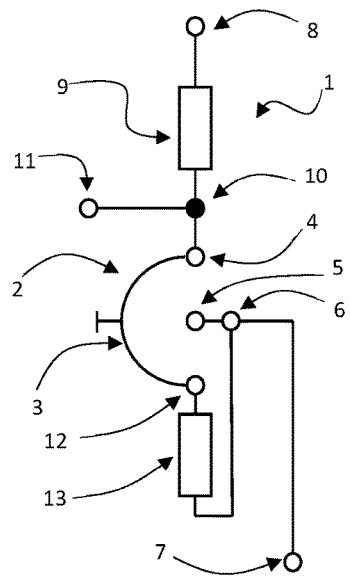
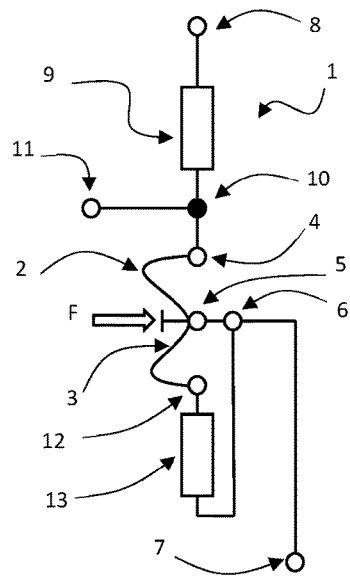
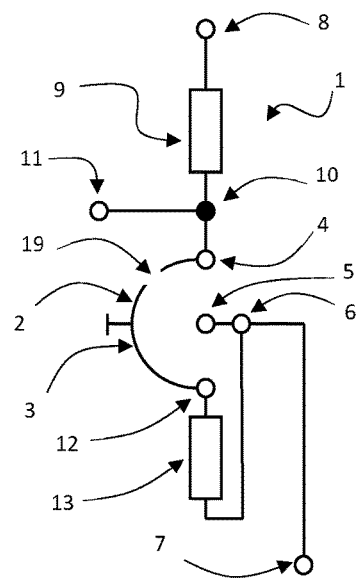
Fig. 1a             Fig. 1b             Fig. 1c
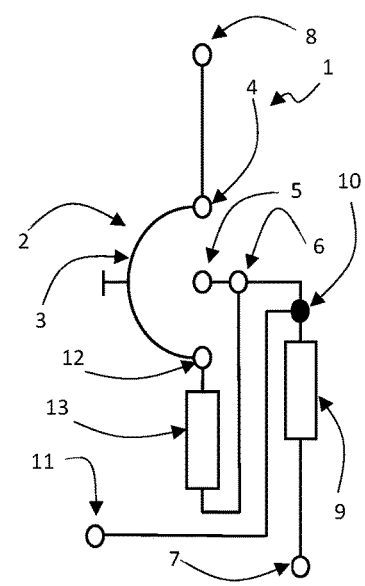
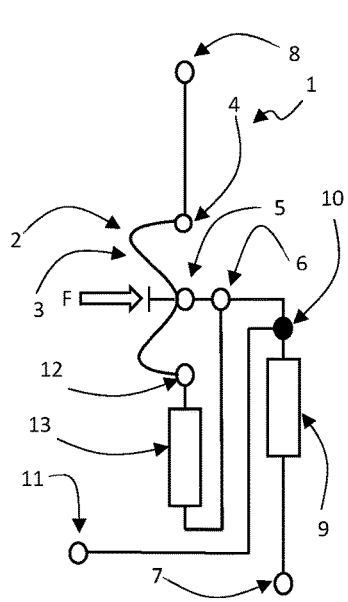
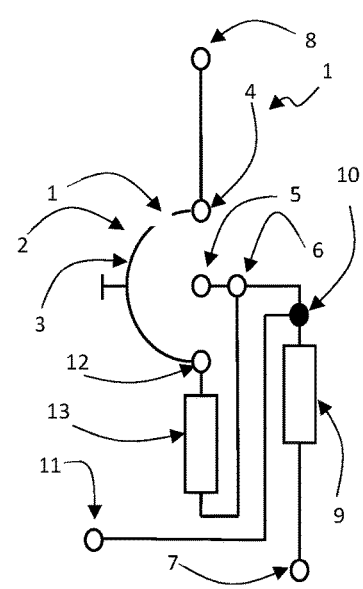
Fig. 2a             Fig. 2b             Fig. 2c

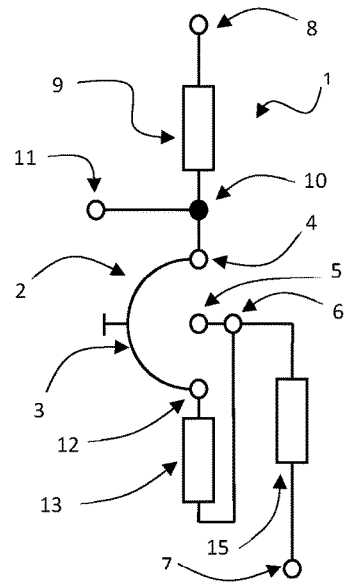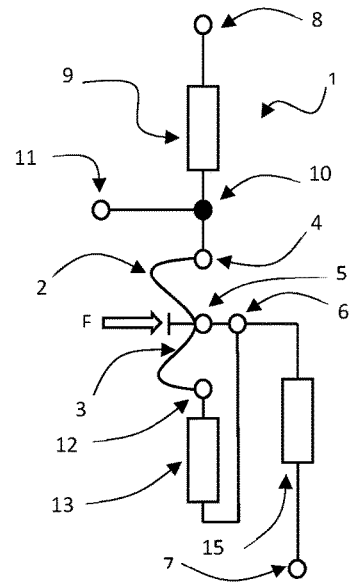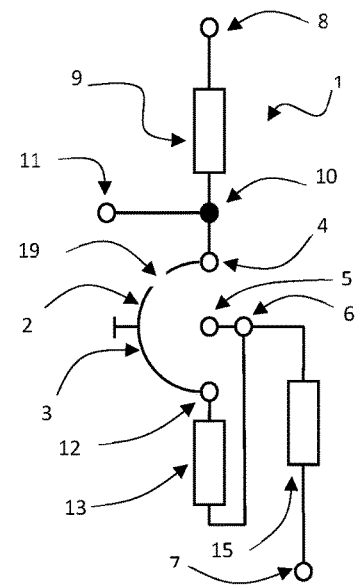
Fig. 3a  Fig. 3b  Fig. 3c
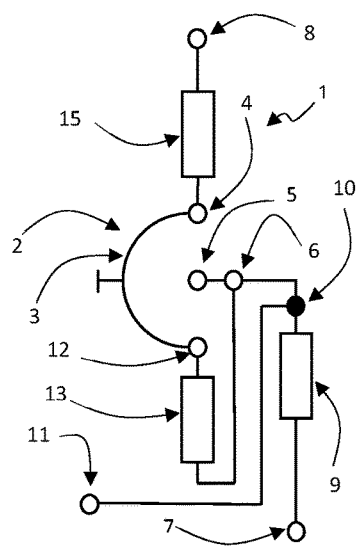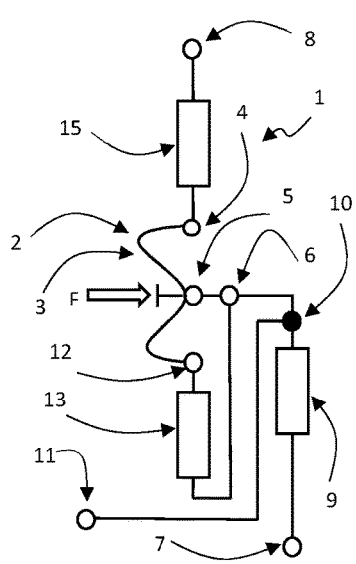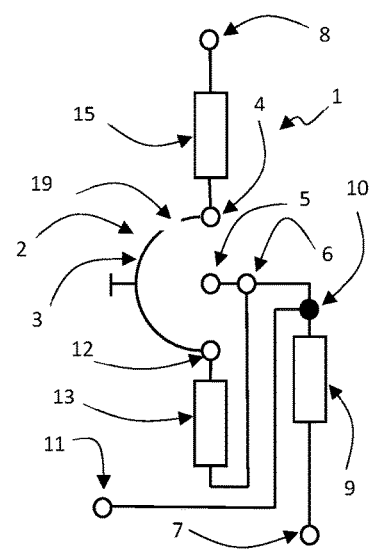
Fig. 4a  Fig. 4b  Fig. 4c

INPUT DEVICE FOR A MOTOR VEHICLE WITH VOLTAGE-BASED ERROR DETECTION

The invention relates to an input device for safety-relevant functions of a motor vehicle. The input device comprises a switch element which has a switch contact with a first connection and a mating contact with a second connection. When the input device is actuated, the switch contact makes contact with the mating contact. In addition, the input device comprises a first resistor as well as a first and a second voltage supply connection, via which an operating voltage for the input device can be provided. Here, the first voltage supply connection is connected to one of the connections of the switch element, and the second voltage supply connection is connected to the other connection of the switch element via the first resistor. Furthermore, the input device has a measuring node which is provided between the first resistor and the associated connection of the switch element and which is connected to a measuring connection. Thus, an actuation-dependent voltage which is dependent on the actuation of the input device can be detected via the measuring connection.

Input devices with corresponding switch elements are already known from the prior art. For example, U.S. Pat. No. 6,423,918 B1 discloses an input device with a switch element that has a rounded or domed switch contact which, when actuated, is brought into contact with a mating contact on a printed circuit board. The rounded or dome-shaped switch contact is held here on the printed circuit board by retaining elements.

U.S. Pat. No. 7,825,345 B1 discloses an input device in the form of a microswitch that can be actuated from the rear side. For this purpose, the microswitch has, in its housing, a rounded or dome-shaped switch element, which, when actuated, is brought into contact with a mating contact in the housing. The respective contacts are connected to connections provided externally on the microswitch housing.

US 2014/0144765 A1 discloses an input device with a switch element that has a rounded or dome-shaped switch contact which, when actuated, is brought into contact with a mating contact on a printed circuit board. The rounded or dome-shaped switch contact is held here on the printed circuit board by retaining elements.

EP 2 001 034 A2 discloses an input device with a switch element that has a switch contact which, when actuated, is brought into contact with a mating contact on a printed circuit board. The switch contact is connected to a first voltage supply connection via an electrode and the mating contact is connected to a second voltage supply connection via a first resistor. The voltage dropped across the resistor is measured and is a measure of the actuation of the input device.

A disadvantage of the cited prior art is that a fault in the switch contact cannot be detected unambiguously and reliably, since, for example, a break in the switch contact cannot be distinguished from a failure to actuate the input device. As a result, such input devices cannot be used in safety-relevant applications, for example in autonomous driving of a motor vehicle.

It is therefore the object of the invention to further develop the input devices of the type in question such that they meet higher safety standards and can thus be used for safety-relevant applications in motor vehicles.

This object is achieved by the solution according to the characterizing part of claim 1, according to which the switch element has a third connection which is connected to the switch contact, wherein a second resistor is provided which is connected to the second and third connections of the switch element, so that, in the event of a fault of the switch contact at the measuring node, an error voltage can be detected via the measuring connection and can be distinguished from the actuation-dependent voltage. This has the advantage that the switching states of the switch element, open and closed, can be clearly distinguished from a fault or fault state of the switch contact, since each state supplies a clearly distinguishable voltage at the measuring node.

For the purpose of this invention, a fault of the switch contact is understood to be the break of the switch contact and/or any change in the resistance of the switch contact that leads to a voltage at the measuring node which can be distinguished from the switching states. This applies in particular for the case when the aforementioned fault occurs in the region of the switch contact between the first and third connections. In this case, the electrical connection between the first and third connections is affected by the fault.

In an advantageous embodiment of the input device according to the invention, an evaluation circuit is provided which detects the voltage at the measuring node via the measuring connection and can thereby identify an actuation of the input device and/or a fault of the switch contact. This has the advantage that the various voltages at the measuring node can be identified and evaluated accordingly, so that the state of the input device can be determined unambiguously. Another advantage of evaluation circuits is that they can process the information further, for example by a controller or a control unit, which can be part of the evaluation circuit, to trigger corresponding functions in the vehicle or to output corresponding warnings.

Alternatively or additionally, the input device according to the invention can be provided with a rounded or dome-shaped switch contact and preferably the first and third connections are provided in opposite regions of the rounded or dome-shaped switch contact. On the one hand, this has the advantage that a passive haptic or a passive haptic feedback to the actuator can be generated by the rounded or dome-shaped switch contact when actuated.

Due to its rounded or dome-shaped form, the metal switch contact has a non-linear deformation characteristic with constantly increasing actuation force, in the sense of a dome switch or a clicker. As a result, the switch contact only yields abruptly when actuated at a certain pressure point, which leads to corresponding haptic feedback at the actuator. After the switch contact is released, it is returned to its initial state.

On the other hand, the arrangement of the first and third connections in mutually opposed regions of the rounded or dome-shaped switch contact has the advantage that the error detection of the input device according to the invention is improved. This is because this measure maximizes or at least increases the area of the switch contact between the connections, so that any faults within this area can be detected accordingly.

In a further advantageous embodiment of the input device according to the invention, the switch contact is of planar design. Preferably, the first and third connections are provided adjacent to an edge or in opposite regions of the planar switch contact. The planar contact can be elastic and/or can be provided with an embossing in order to generate a haptic feedback for the actuator. The embossing can also be used here to provide a non-linear deformation characteristic with constantly increasing actuating force, in the sense of a snap disc or a click frog.

On the other hand, the arrangement of the first and third connections in opposite regions of the planar switch contact has the advantage that the fault detection of the input device according to the invention is improved. This is because this measure maximizes or at least increases the area of the switch contact between the connections, so that any faults within this area can be detected accordingly.

Alternatively or additionally, in the input device according to the invention, it can be provided that a third resistor is provided between the first voltage supply connection and the associated connection of the switch element so that the particular connection of the switch element is connected to the first voltage supply connection via the third resistor. By means of this additional resistor, the actuation of the switch contact is detectable by means of an actuation-dependent voltage which is different from the operating voltage or from one of the operating voltage potentials. This further improves the reliability of the input device according to the invention, since the actuation can now be distinguished from a closure of the measuring connection against one of the operating voltage potentials in the event of a fault.

In a further advantageous embodiment of the input device according to the invention, the second voltage supply connection is connected to a positive operating voltage and the first voltage supply connection is connected to a reference potential, preferably ground, of the input device. By way of this measure, the operating voltage can be provided in a simple manner. Alternatively, the first voltage supply connection can be connected to a positive operating voltage and the second voltage supply connection can be connected to a reference potential, preferably ground, of the input device.

Alternatively or additionally, in the input device according to the invention it can be provided that, in the unactuated state of the input device, an actuation-dependent voltage can be detected at the measuring node, which voltage results from the voltage divider ratio between the first resistor and the second resistor and preferably the third resistor. The actuation-dependent voltage in the non-actuated state is calculated as follows with $U_1$ as the actuation-dependent voltage, $U_B$ as the positive operating voltage, $R_1$ as the first resistor, $R_2$ as the second resistor and $R_3$ as the third resistor:

$$U_1 = U_B * \frac{R_2}{R_2 + R_1} \text{ (If } R_1 \text{ is present at } U_B \text{ and without } R_3 \text{) or}$$

$$U_1 = U_B * \frac{R_1}{R_2 + R_1} \text{ (If } R_1 \text{ is present at ground and without } R_3 \text{) or}$$

$$U_1 = U_B * \frac{R_2 + R_3}{R_2 + R_1 + R_3} \text{ (If } R_1 \text{ is present at } U_B \text{ and with } R_3 \text{) or}$$

$$U_1 = U_B * \frac{R_1}{R_2 + R_1 + R_3} \text{ (If } R_1 \text{ is present at ground and with } R_3 \text{)}$$

This has the advantage that the actuation-dependent voltage is clearly different from the actuation state or the error state, and thus the safety of the input device according to the invention is increased.

In a further advantageous embodiment of the input device according to the invention, an actuation-dependent voltage can be detected at the measuring node in the actuated state of the input device, which voltage corresponds to the voltage or potential of the first voltage supply connection or results from the voltage divider ratio between the first resistor and the third resistor. The actuation-dependent voltage in the actuated state is calculated as follows with $U_1$ as actuation-dependent voltage, $U_B$ as positive operating voltage, $R_1$ as first resistor, $R_2$ as second resistor and $R_3$ as third resistor:

$$U_1 = \text{Ground (If } R_1 \text{ is present at } U_3 \text{ and without } R_3\text{) or}$$

$$U_1 = U_B \text{ (If } R_1 \text{ is present at ground and without } R_3\text{) or}$$

$$U_1 = U_B * \frac{R_3}{R_1 + R_3} \text{ (If } R_1 \text{ is present at } U_B \text{ and with } R_3\text{) or}$$

$$U_1 = U_B * \frac{R_3}{R_1 + R_3} \text{ (If } R_1 \text{ is present at ground and with } R_3\text{)}$$

This has the advantage that the actuation-dependent voltage is clearly different from the unactuated state or the error state, thus increasing the safety of the input device according to the invention.

In a further advantageous embodiment of the input device according to the invention, in the event of a fault in the switch contact, preferably in the event of a break of the switch contact, in particular between the first and third connections of the switch contact, and preferably if the switch contact is not actuated, an error voltage which corresponds to the voltage or potential of the second voltage supply connection can be detected at the measuring node. The error voltage is calculated as follows with $U_2$ as error voltage, $U_B$ as positive operating voltage, $R_1$ as first resistor, $R_2$ as second resistor and $R_3$ as third resistor:

$U_2 = U_B$(If $R_1$ is present at $U_B$ and without $R_3$)

or $U_2 =$ Ground(If $R_1$ is present at ground and without $R_3$)

or $U_2 = U_B$(If $R_1$ is present at $U_B$ and with $R_3$)

or $U_2 =$ Ground(If $R_1$ is present at ground and with $R_3$)

This has the advantage that the error voltage is clearly different from the unactuated state or the actuated state, thus increasing the safety of the input device according to the invention.

In a further advantageous embodiment of the input device according to the invention, the evaluation unit comprises an analog-to-digital converter so that the detected actuation-dependent voltage can be converted into a digital value and digitally processed. Digital values of measured voltages are particularly insensitive to interference, so that the safety of the input device according to the invention is also increased thereby. Furthermore, digital values can be processed particularly effectively, for example to carry out a plausibility check, which in turn increases the safety of the input device according to the invention.

Alternatively or additionally, the input device according to the invention can be provided with galvanic or electrically conductive contacting between the switch contact and the mating contact when the input device is actuated. This means that the switch contact and the mating contact are positioned relative to one another in such a way that an electrically conductive connection is established between them. In particular, this means a direct electrical contact between the switch contact and the mating contact. This type of contacting creates a reliable contact in a particularly advantageous manner, which provides clearly distinguishable voltage values at the measuring node.

In a particularly advantageous embodiment of the input device according to the invention, the contact between the switch contact and the mating contact is resistive or capacitive when the input device is actuated. According to the first alternative, this means that the contact between the switch contact and the mating contact is made via a resistive element, such as a resistive material or a corresponding coating. This has the advantage that an additional resistive element is introduced during actuation, which interacts with the second resistor and thus provides particularly reliably distinguishable voltage values at the measuring node.

According to the second alternative, the contact can also be made via a capacitive element, for example a capacitor, so that when an AC voltage is used as the operating voltage and a corresponding actuation takes place, the transition between the switch contact and the mating contact becomes low-impedance. In this way, too, reliably distinguishable voltage values can be provided at the measuring node in an advantageous manner.

Alternatively or additionally, in the input device according to the invention, the switch element and the resistors are arranged on a printed circuit board and preferably at least the first and third connections are embodied as solder points on the printed circuit board. By way of this measure, the input device according to the invention can be provided in a particularly compact design.

In a further advantageous embodiment of the input device according to the invention, the rounded or dome-shaped switch contact is soldered to the solder points for the first and third connections and the mating contact is provided between these two solder points on the printed circuit board. This measure allows the rounded or dome-shaped switch contact to be supported on the printed circuit board in an advantageous manner in order to provide haptic feedback to the actuator in the sense of a dome switch. The mating contact arranged between the solder points ensures reliable contact here during actuation between the switch contact and the mating contact as well as a compact design of the input device according to the invention.

In a further advantageous embodiment of the input device according to the invention, further support points for the rounded or dome-shaped switch contact are provided and are preferably embodied as solder points. As a result, the rounded or dome-shaped switch contact is held particularly securely on the printed circuit board, so that the overall safety of the input device according to the invention is improved.

Figure 5B:
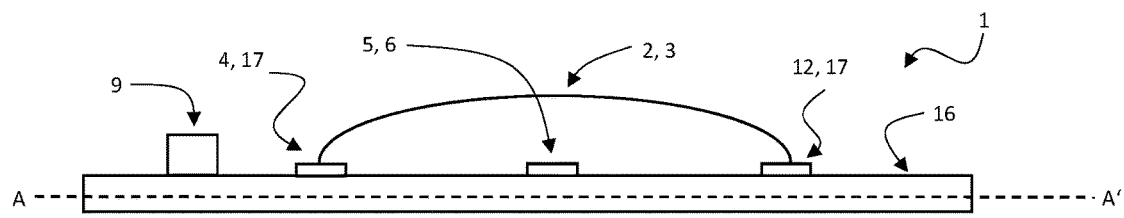
Figure 6A:
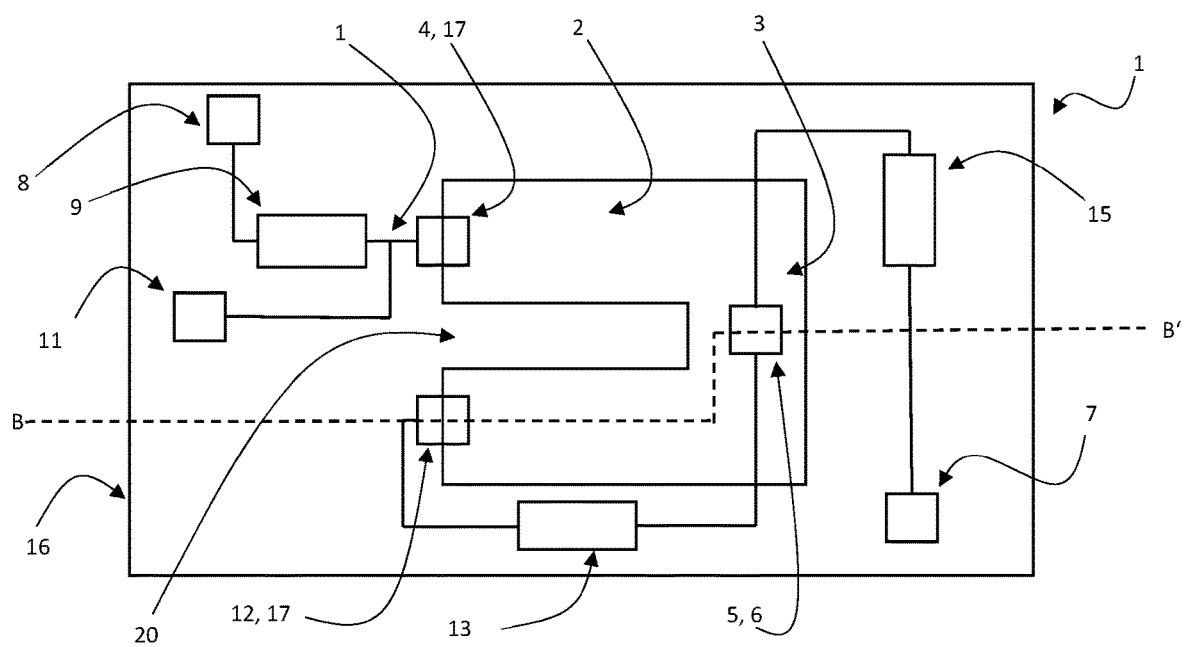
Figure 6B:
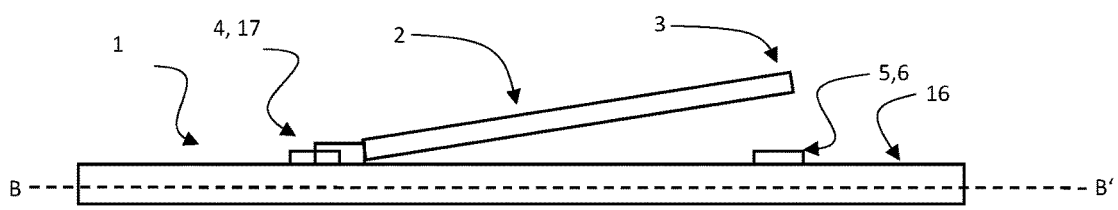

The invention will now be explained in more detail on the basis of preferred exemplary embodiments, in particular with reference to the attached drawings. In the drawings:

FIG. 1a shows schematically the circuit diagram of a first advantageous exemplary embodiment of the input device according to the invention in the unactuated state of the switch element, FIG. 1b shows schematically the circuit diagram of the first advantageous exemplary embodiment of the input device according to the invention in the unactuated state of the switch element, FIG. 1c shows schematically the circuit diagram of the first advantageous exemplary embodiment of the input device according to the invention in the event of a fault at the switch element, FIG. 2a shows schematically the circuit diagram of a second advantageous exemplary embodiment of the input device according to the invention in the unactuated state of the switch element, FIG. 2b shows schematically the circuit diagram of the second advantageous exemplary embodiment of the input device according to the invention in the unactuated state of the switch element, FIG. 2c shows schematically the circuit diagram of the second advantageous exemplary embodiment of the input device according to the invention in the event of a fault at the switch element, FIG. 3a shows schematically the circuit diagram of a third advantageous exemplary embodiment of the input device according to the invention in the unactuated state of the switch element, FIG. 3b shows schematically the circuit diagram of the third advantageous exemplary embodiment of the input device according to the invention in the unactuated state of the switch element, FIG. 3c shows schematically the circuit diagram of the third advantageous exemplary embodiment of the input device according to the invention in the event of a fault at the switch element, FIG. 4a shows schematically the circuit diagram of a fourth advantageous exemplary embodiment of the input device according to the invention in the unactuated state of the switch element, FIG. 4b shows schematically the circuit diagram of the fourth advantageous exemplary embodiment of the input device according to the invention in the unactuated state of the switch element, FIG. 4c shows schematically the circuit diagram of the fourth advantageous exemplary embodiment of the input device according to the invention in the event of a fault at the switch element, FIG. 5a shows schematically a fifth advantageous exemplary embodiment of the input device according to the invention with a printed circuit board, FIG. 5b shows a sectional view through the printed circuit board of the input device according to the invention in accordance with the fifth exemplary embodiment, FIG. 6a shows schematically a sixth advantageous exemplary embodiment of the input device according to the invention with a printed circuit board, and FIG. 6b shows a sectional view through the printed circuit board of the input device according to the invention in accordance with the sixth exemplary embodiment.

FIG. 1a shows schematically the circuit diagram of a first advantageous exemplary embodiment of the input device (1) according to the invention in the unactuated state. The input device (1) has a switch element (2) with a rounded- or dome-shaped switch contact (3), which, when actuated, can be contacted with a mating contact (5). The switch element (2) has, on the rounded or dome-shaped switch contact (3), a first connection (4) to which a first resistor (9) is connected to a second voltage supply connection (8). In this example, the operating voltage $U_B$ applied here is positive. Between the first resistor (9) and the first connection (4) of the switch element (2) there is a measuring node (10), at which a measuring connection (11) is provided for tapping an actuation-dependent voltage $U_1$.

A second connection (6) of the switch element (2) is provided on the mating contact (5). This second connection (6) connects the mating contact (5) to a first voltage supply connection (7).

In this example, the first voltage supply connection (7) is connected to the reference potential of the input device (1) according to the invention, which in this case is the ground or the ground potential. Furthermore, the switch element (2) has a third connection (12), which is provided on the switch contact (3) on the opposite side of the first connection (4). A second resistor (13) is connected between the second and third connections (6, 12).

In the unactuated state of the input device (1) according to the invention or when the switch element (2) is not actuated, an actuation-dependent voltage $U_1$, which results from the voltage divider ratio between the first resistor (9) and the second resistor (13), can be tapped at the measuring connection (11). The following relationship applies, with $U_1$ as the actuation-dependent voltage, $U_B$ as the positive operating voltage, $R_1$ as the first resistor and $R_2$ as the second resistor:

$$U_1 = U_B * \frac{R_2}{R_2 + R_1}$$

This voltage $U_1$ is, as will be shown, clearly distinguishable from the voltages of the other states of the input device (1) according to the invention, so that the non-actuation of the input device (1) according to the invention can be clearly identified.

For example, FIG. 1b shows the input device (1) according to the invention in accordance with the exemplary embodiment in FIG. 1a, wherein the input device according to the invention is now in an actuated state. The switch element (2) has been actuated by a force F acting on the switch contact (3). Due to the action of the force F and the design of the switch element (2) with a rounded or dome-shaped switch contact (3), the switch contact (3) is deformed and is electrically connected to or contacted with the mating contact (5). The corresponding deformation of the switch contact (3) additionally generates a haptic feedback for the actuator.

As a result of the actuation, the second resistor (13) between the second connection (6) and the third connection (12) of the switch element (2) is bridged or short-circuited, and the measuring node (10) is directly connected to the mating contact (5) or to the second connection (6) of the switch element (2). In this exemplary embodiment, the second connection (6) is connected to the first voltage supply connection (7), which is at the reference potential of the input device (1) according to the invention, which in this case is the ground or ground potential. Thus, the measuring node (10) is also connected to ground, so that the following actuation-dependent voltage $U_1$ can be measured at the measuring connection (11):

$U_1$=Ground

This voltage $U_1$ is also clearly distinguishable from the voltages of the other states of the input device (1) according to the invention. This means that the actuation of the input device (1) according to the invention can be clearly identified.

FIG. 1c shows the input device (1) according to the exemplary embodiment in FIG. 1a, wherein a fault has now occurred at the switch contact (3) of the switch element (2). Accordingly, the input device (1) according to the invention is in an error state. The error comprises a break (19) of the switch contact (3) between the first connection (4) and the third connection (12) of the switch element (2).

As a result, the connection of the first connection (4) to the other connections (6, 12) of the switch element (2) is interrupted, so that the measuring node (10) is always at the potential of the second voltage supply connection (8), which in this case is the operating voltage $U_B$. Thus, the following error voltage $U_2$ can be measured at the measuring connection (11):

$U_2 = U_B$

This voltage $U_2$ is also clearly distinguishable from the voltages of the other states of the input device (1) according to the invention. This also clearly identifies the error condition of the input device (1) according to the invention.

FIG. 2a shows a further exemplary embodiment of the input device (1) according to the invention. This example is based in essence on the exemplary embodiment according to FIG. 1a, wherein now the first resistor (9) is arranged between the first voltage supply connection (7) and second connection (6) of the switch element (2), instead of between the second voltage supply connection (8) and the first connection (4) of the switch element (2). Accordingly, the measuring node (10) with the measuring connection (11) is provided between the second connection (6) of the switch element (2) and the first resistor (9). Furthermore, the first connection (4) of the switch element (2) is now directly connected to the second voltage supply connection (8). In this example, the first voltage supply connection (7) is connected to the reference potential, in this case the ground, of the input device (1) according to the invention. The second voltage supply connection (8) is connected to a positive operating voltage $U_B$.

In the unactuated state of the input device (1) according to the invention in accordance with this second exemplary embodiment or when the switch element (2) is not actuated, an actuation-dependent voltage $U_1$, which results from the voltage divider ratio between the first resistor (9) and the second resistor (13), can be tapped at the measuring connection (11). The following relationship applies, with $U_1$ as the actuation-dependent voltage, $U_B$ as the positive operating voltage, $R_1$ as the first resistor and $R_2$ as the second resistor:

$$U_1 = U_B * \frac{R_1}{R_2 + R_1}$$

This voltage $U_1$ is clearly distinguishable from the voltages of the other states of the input device (1) according to the invention in accordance with this second exemplary embodiment.

Thus, the non-actuation of the input device (1) according to the invention can be clearly identified.

FIG. 2b shows the input device (1) according to the invention in accordance with the second exemplary embodiment, wherein it is now in an actuated state. The switch element (2) has been actuated by a force F acting on the switch contact (3). Due to the action of the force F and the design of the switch element (2) with a rounded or dome-shaped switch contact (3), the switch contact (3) is deformed and is electrically connected to or contacted with the mating contact (5).

As a result, the second resistor (13) between the second connection (6) and the third connection (12) of the switch element (2) is bridged or short-circuited and the measuring node (10) is directly connected to the first connection (4) of the switch element (2). Since the first connection (4) is connected to the second voltage supply connection (8), which is at the positive operating voltage potential, the measuring node (10) is thereby also at the positive operating voltage potential, so that the following actuation-dependent voltage $U_1$ can be measured at the measuring connection (11):

$$U_1 = U_B$$

This voltage $U_1$ is also clearly distinguishable from the voltages of the other states of the input device (1) according to the invention in accordance with this second exemplary embodiment. This also clearly identifies the actuation of the input device (1) according to the invention.

FIG. 2c shows the input device (1) according to the invention in accordance with the second exemplary embodiment of FIG. 2a, wherein a fault has now occurred at the switch contact (3) of the switch element (2). Accordingly, the input device (1) according to the invention is in an error state. The error comprises a break (19) of the switch contact (3) between the first connection (4) and the third connection (12) of the switch element (2).

As a result, the connection of the first connection (4) to the other connections (6, 12) of the switch element (2) is interrupted, so that the measuring node (10) is now at the potential of the first voltage supply connection (7), which corresponds here to the reference potential. Thus, the following error voltage $U_2$ can be measured at the measuring connection (11):

$$U_2 = \text{Ground}$$

This voltage $U_2$ can also be clearly distinguished from the voltages of the other states of the input device (1) according to the invention in accordance with the second exemplary embodiment. Thus, the error of the input device (1) according to the invention can also be clearly identified.

FIG. 3a shows a third exemplary embodiment of the input device (1) according to the invention. This example is based in essence on the exemplary embodiment according to FIG. 1a, wherein a third resistor (15) is now provided. The third resistor (15) is connected or arranged between the second connection (6) of the switch element (2) and the first voltage supply connection (7). In this example, the first voltage supply connection (7) is also connected to the reference potential, here the ground, of the input device (1) according to the invention, and the second voltage supply connection (8) is connected to a positive operating voltage $U_B$.

In the unactuated state of the input device (1) according to the invention in accordance with this third exemplary embodiment, or when the switch element (2) is not actuated, an actuation-dependent voltage $U_1$, which results from the voltage divider ratio between the first resistor (9), the second resistor (13) and the third resistor (15), can be tapped at the measuring connection (11). The following relationship applies, with $U_1$ as the actuation-dependent voltage, $U_B$ as the positive operating voltage, $R_1$ as the first resistor, $R_2$ as the second resistor and $R_3$ as the third resistor:

$$U_1 = U_B * \frac{R_2 + R_3}{R_2 + R_1 + R_3}$$

This voltage $U_1$ can be clearly distinguished from the voltages of the other states of the input device (1) according to the invention in accordance with the third exemplary embodiment, and thus the non-actuation of the input device (1) according to the invention can be clearly identified.

FIG. 3b shows the input device (1) according to the invention in accordance with the third exemplary embodiment, wherein it is now in an actuated state. The switch element (2) has been actuated by a force F acting on the switch contact (3). Due to the action of the force F and the design of the switch element (2) with a rounded or dome-shaped switch contact (3), the switch contact (3) is deformed and is electrically connected to or contacted with the mating contact (5).

As a result, the second resistor (13) between the second connection (6) and the third connection (12) of the switch element (2) is bridged or short-circuited and the measuring node (10) is directly connected to the second connection (4) of the switch element (2). Thus, the measuring node (10) is now located between the first resistor (9) and the third resistor (15), so that the following actuation-dependent voltage $U_1$ can be measured at the measuring connection (11):

$$U_1 = U_B * \frac{R_3}{R_1 + R_3}$$

This voltage $U_1$ can also be clearly distinguished from the other states of the input device (1) according to the invention in accordance with this exemplary embodiment, and thus the actuation of the input device (1) according to the invention can be clearly identified.

FIG. 3c shows the input device (1) according to the invention in accordance with the third exemplary embodiment of FIG. 3a, wherein a fault has now occurred at the switch contact (3) of the switch element (2). Accordingly, the input device (1) according to the invention is in an error state. The error comprises a break (19) of the switch contact (3) between the first connection (4) and the third connection (12) of the switch element (2).

As a result, the connection of the first connection (4) to the other connections (6, 12) of the switch element (2) is interrupted, so that the measuring node (10) is always at the potential of the second voltage supply connection (8), which here corresponds to the positive operating voltage. Thus, the following error voltage $U_2$ can be measured at the measuring connection (11):

$$U_2 = U_B$$

This voltage $U_2$ can also be clearly distinguished from the voltages of the other states of the input device (1) according to the invention in accordance with the third exemplary embodiment. Thus, the error of the input device (1) according to the invention can also be clearly identified.

FIG. 4a shows a fourth exemplary embodiment of the input device (1) according to the invention. This example is based in essence on the exemplary embodiment according to FIG. 2a, wherein a third resistor (15) is now provided. The third resistor (15) is connected or arranged between the first connection (4) of the switch element (2) and the second voltage supply connection (8). In this example, the first voltage supply connection (7) is also connected to the reference potential, here the ground, of the input device (1) according to the invention, and the second voltage supply connection (8) is connected to a positive operating voltage $U_B$.

In the unactuated state of the input device (1) according to the invention in accordance with this fourth exemplary embodiment or when the switch element (2) is not actuated, an actuation-dependent voltage $U_1$, which results from the voltage divider ratio between the first resistor (9), the second resistor (13) and the third resistor (15), can be tapped at the measuring connection (11). The following relationship applies, with $U_1$ as the actuation-dependent voltage, $U_B$ as the positive operating voltage, $R_1$ as the first resistor, $R_2$ as the second resistor and $R_3$ as the third resistor:

$$U_1 = U_B * \frac{R_1}{R_2 + R_1 + R_3}$$

This voltage $U_1$ can be clearly distinguished from the voltages of the other states of the input device (1) according to the invention in accordance with this exemplary embodiment, and thus the non-actuation of the input device (1) according to the invention can be clearly identified.

FIG. 4b shows the input device (1) according to the invention in accordance with the fourth exemplary embodiment, wherein it is now in an actuated state. The switch element (2) has been actuated by a force F acting on the switch contact (3). Due to the action of the force F and the design of the switch element (2) with a rounded or dome-shaped switch contact (3), the switch contact (3) is deformed and is electrically connected to or contacted with the mating contact (5).

As a result, the second resistor (13) between the second connection (6) and the third connection (12) of the switch element (2) is bridged or short-circuited and the measuring node (10) is directly connected to the first connection (4) of the switch element (2). Thus, the measuring node (10) is now located between the first resistor (9) and the third resistor (15), so that the following actuation-dependent voltage $U_1$ can be measured at the measuring connection (11):

$$U_1 = U_B * \frac{R_1}{R_1 + R_3}$$

This voltage $U_1$ can also be clearly distinguished from the voltages of the other states of the input device (1) according to the present embodiment, and thus the actuation of the input device (1) according to the present embodiment can be clearly identified.

FIG. 4c shows the input device (1) according to the invention in accordance with the fourth exemplary embodiment of FIG. 4a, wherein a fault has now occurred at the switch contact (3) of the switch element (2). Accordingly, the input device (1) according to the invention is in an error state. The error comprises a break (19) of the switch contact (3) between the first connection (4) and the third connection (12) of the switch element (2).

As a result, the connection of the first connection (4) to the other connections (6, 12) of the switch element (2) is interrupted, so that the measuring node (10) is now at the potential of the first voltage supply connection (7), which corresponds here to the reference potential. Thus, the following error voltage $U_2$ can be measured at the measuring connection (11):

$U_2$=Ground

This voltage $U_2$ is also clearly distinguishable from the voltages of the other states of the input device (1) according to the invention in accordance with the fourth exemplary embodiment. Thus, the error case of the input device (1) according to the invention can also be clearly identified.

FIG. 5a schematically shows a fifth exemplary embodiment of the input device (1) according to the invention, wherein here the circuit of the input device (1) according to the invention is shown on a printed circuit board (16). The circuit here corresponds substantially to the exemplary embodiment according to FIG. 3a, wherein the reference signs for the various components have been chosen identically. The various components are not repeated, since they are completely analogous to the exemplary embodiment according to FIG. 3a.

The switch contact (3) is rounded or dome-shaped and arranged on the printed circuit board (16). For this purpose, the switch element (2) is provided with two connections (4, 12), which are embodied in the form of solder points (17) on the printed circuit board (16). In addition, further solder points (17) are provided on the printed circuit board (16) as support points (18) for the switch contact (3) for fastening the switch contact (2) to the printed circuit board (16). This allows the corresponding switch contact (3) to deform when actuated, generating a haptic feedback to the actuator. This closes a contact between the switch contact (3) and the mating contact (5), which is arranged centrally below the switch contact (3).

The arrangement of the contacts is again illustrated in FIG. 5b, which is a sectional view through the axis of section A-A' of FIG. 5a. Here, the rounded or dome-shaped form of the switch contact (3) is illustrated, wherein the switch contact (3) is fastened to the solder points (17), which additionally serve here as connections (4, 12) of the switch element (2). The mating contact (5) is arranged centrally below the rounded or dome-shaped switch contact (3). FIG. 5b shows the input device (1) according to the invention in the fifth exemplary embodiment in the unactuated state.

FIG. 6a schematically shows a sixth exemplary embodiment of the input device (1) according to the invention, wherein the circuit of the input device (1) according to the invention is shown here on a printed circuit board (16). The circuit here corresponds substantially to the exemplary embodiment according to FIG. 3a, wherein the reference signs for the various components have been chosen identically. The various components are not repeated, since they are completely analogous to the exemplary embodiment according to FIG. 3a.

The switch contact (2) is of planar design and arranged on the printed circuit board (16). For this purpose, the switch element (2) is provided with two connections (4, 12), which are embodied in the form of solder points (17) on the printed circuit board (16). The switch contact (3) of the switch element (2) is designed to be resilient in order to close the contact between the switch contact (3) and the mating contact (5) in the sense of a push-button. The planar switch contact (3) also has a slot (20), so that the switch contact (3) has two separate connection regions on which the first connection (4) and the third connection (12) are provided.

The arrangement of the contacts is again illustrated in FIG. 6b, which is a sectional view through the axis of section B-B' of FIG. 6a. Here, the planar form of the switch contact (3) is illustrated, wherein the switch contact (3) is fastened to the solder point (17), which here additionally serves as the connection (4) of the switch element (2). The mating contact (5) is arranged in the vicinity of the end region of the switch contact (3) on the printed circuit board (16), so that the switch contact (3), when actuated, moves in the direction of the mating contact (5) until the contact is closed. FIG. 6b shows the input device (1) according to the invention in accordance with the sixth exemplary embodiment in the unactuated state.

The invention claimed is:

1. An input device for safety-relevant functions of a motor vehicle, comprising:

a switch element, which has a switch contact with a first connection and a mating contact with a second connection, wherein the switch contact is configured to make contact with the mating contact when the input device is actuated;

a first resistor, with a first and second voltage supply connection via which an operating voltage for the input device is provided, wherein the first voltage supply connection is connected to one of the connections of the switch element and the second voltage supply connection is connected via the first resistor to the other connection of the switch element;

a measuring node provided between the first resistor and the associated connection of the switch element and which is connected to a measuring connection, so that an actuation-dependent voltage, which is dependent on the actuation of the input device, is detected via the measuring connection, wherein the switch element has a third connection which is connected to the switch contact, wherein a second resistor is provided which is connected to the second and third connections of the switch element so that, in the event of a fault of the switch contact, or a break of the switch contact, an error voltage is detected at the measuring node via the measuring connection and is distinguished from the actuation-dependent voltage; and an evaluation circuit configured to detect the voltage at the measuring node via the measuring connection and thereby identify an actuation of the input device and/or a fault of the switch contact, wherein the switch contact is rounded or dome-shaped and the first and third connections are provided in opposite regions of the rounded or dome-shaped switch contact.

2. The input device as claimed in claim 1, wherein a third resistor is provided between the first voltage supply connection and the associated connection of the switch element so that the particular connection of the switch element is connected to the first voltage supply connection via the third resistor.

3. The input device as claimed in claim 1, wherein the second voltage supply connection is connected to a positive operating voltage and the first voltage supply connection is connected to a reference potential of the input device.

4. The input device as claimed in claim 1, wherein in the unactuated state of the input device an actuation-dependent voltage is detected at the measuring node, which voltage results from the voltage divider ratio between the first resistor and the second resistor and a third resistor.

5. The input device as claimed in claim 1, wherein in the actuated state of the input device an actuation-dependent voltage which corresponds to the voltage or potential of the first voltage supply connection or results from the voltage divider ratio between the first resistor and a third resistor is detected at the measuring node.

6. The input device as claimed in claim 1, wherein in the event of the fault of the switch contact or the break of the switch contact, the error voltage which corresponds to the voltage or potential of the second voltage supply connection is detected at the measuring node.

7. The input device as claimed in claim 1, wherein the evaluation unit comprises an analog-to-digital converter so that the detected voltage can be converted into a digital value and digitally processed.

8. The input device as claimed in claim 1, wherein, when the input device is actuated, the contact between the switch contact and the mating contact is galvanic or electrically conductive.

9. The input device as claimed in claim 1, wherein, when the input device is actuated, the contact between the switch contact and the mating contact is resistive or capacitive.

10. The input device as claimed in claim 1, wherein the switch element and the resistors are arranged on a printed circuit board and at least the first and third connections are solder points on the printed circuit board.

11. The input device as claimed in claim 10, wherein the rounded or dome-shaped switch contact is soldered to the solder points for the first and third connections and the mating contact is provided between these two solder points on the printed circuit board.

12. The input device as claimed in claim 11, wherein further support points for the rounded or dome-shaped switch contact are provided on the printed circuit board and are solder points.

* * * * *